(12) United States Patent
Takeguchi et al.

(10) Patent No.: US 7,813,138 B2
(45) Date of Patent: Oct. 12, 2010

(54) ELECTRONIC DEVICE

(75) Inventors: Koichiro Takeguchi, Tokyo (JP); Daisuke Maehara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/484,101

(22) Filed: Jun. 12, 2009

(65) Prior Publication Data

US 2010/0073887 A1 Mar. 25, 2010

(30) Foreign Application Priority Data

Sep. 22, 2008 (JP) ............................. 2008-243380

(51) Int. Cl.
*H05K 1/00* (2006.01)
(52) U.S. Cl. ...................... 361/749; 361/760; 361/752; 361/818
(58) Field of Classification Search ......... 361/749–753, 361/760–764, 816, 818; 174/254–261
See application file for complete search history.

(56) References Cited

U.S. PATENT DOCUMENTS

| | | | | |
|---|---|---|---|---|
| 4,858,073 A | * | 8/1989 | Gregory | 361/708 |
| 5,220,488 A | * | 6/1993 | Denes | 361/749 |
| 5,812,375 A | * | 9/1998 | Casperson | 361/707 |
| 6,797,888 B2 | * | 9/2004 | Ookawa et al. | 174/255 |
| 2008/0174951 A1 | * | 7/2008 | Mundt et al. | 361/686 |

FOREIGN PATENT DOCUMENTS

| | | |
|---|---|---|
| JP | H08-228059 A | 9/1996 |
| JP | 2002-008749 | 1/2002 |
| JP | 2002-056935 | 2/2002 |
| JP | 2003-069280 | 3/2003 |
| JP | 2004-103517 | 4/2004 |
| JP | 2004-193082 A | 7/2004 |
| JP | 2007-287380 | 11/2007 |

OTHER PUBLICATIONS

Notification of Reasons for Rejection mailed by Japan Patent Office on Dec. 1, 2009 in the corresponding Japanese patent application No. JP 2008-243380.
Explanation of Non-English Language References.

* cited by examiner

*Primary Examiner*—Tuan T Dinh
(74) *Attorney, Agent, or Firm*—Knobbe, Martens, Olson & Bear LLP (57) ABSTRACT

According to one embodiment, an electronic device includes, a conductive housing, a substrate, a flexible substrate, a reinforcing element, and a conductor. The substrate is configured to be housed in the housing and is mounted with an electronic component. The flexible substrate includes a conductive signal layer stacked on a flexible insulating base material and electrically connected to the substrate, a cover layer covering the signal layer, a first surface mounted with the substrate, and a second surface on the reverse side of the first surface, having a portion where the signal layer is partially exposed. The reinforcing element is provided on the second surface to reinforce the flexible substrate and has an opening corresponding to the portion where the signal layer is partially exposed. The conductor is inserted from the opening of the reinforcing element and connects the signal layer to the housing.

6 Claims, 6 Drawing Sheets

ELECTRONIC DEVICE

CROSS-REFERENCE TO RELATED APPLICATIONS

This application is based upon and claims the benefit of priority from Japanese Patent Application No. 2008-243380, filed on Sep. 22, 2008, the entire contents of which are incorporated herein by reference.

BACKGROUND

1. Field

One embodiment of the invention relates to an electronic device.

2. Description of the Related Art

In recent years, the increased speed of signal frequencies processed by electronic devices and further downsizing of the electronic devices make electromagnetic interference (EMI) countermeasures difficult. The EMI countermeasures are taken to prevent the electronic devices from generating electromagnetic interference. As the EMI countermeasures, it is common to provide an electronic device with an EMI countermeasure component. Examples of the EMI countermeasure component include a conductor that stabilizes the ground (GND) potential and a shielding material that shields the radiation of electromagnetic waves. However, the addition of such an EMI countermeasure component to an electronic device increases the cost and manufacturing steps. Therefore, there is a need for a more effective and lower cost solution for EMI.

For example, Japanese Patent Application Publication (KOKAI) No. 2004-193082 has proposed a grounding structure of an electronic device capable of reducing the radiation of noise as well as strengthening the earth wire of the electronic device while contributing to downsizing of its housing. More specifically, in the grounding structure of an electronic device, a tabular gasket is interposed in a narrow space between a conductor of a flexible substrate and the housing. With this, the flexible substrate and the housing are reliably electrically connected to each other without the addition of an EMI countermeasure component. Thus, the earth wire of the electronic device can be strengthened, and also the radiation of noise can be reduced.

In the grounding structure of an electronic device described above, the conductor is provided on a surface of the flexible substrate. Therefore, when positioned on the surface of the flexible substrate, the gasket is likely to move thereon, and its position cannot be determined specifically. This makes it difficult to effectively position the gasket with high accuracy.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic device comprises a conductive housing, a substrate, a flexible substrate, a reinforcing element, and a conductor. The substrate is configured to be housed in the housing and mounted with an electronic component. The flexible substrate is configured to be formed of a conductive signal layer stacked on a flexible insulating base material and covered with an insulating cover layer. The flexible substrate comprises a first surface provided with a connector to connect to the substrate, and a second surface on the reverse side of the first surface, which has a portion where the signal layer is partially exposed at a position corresponding to where a pad of the connector is provided on the first surface. The reinforcing element is configured to be provided on the second surface to reinforce the flexible substrate and have an opening corresponding to the portion where the signal layer is partially exposed and where the pad of the connector is provided on the first surface. The conductor is configured to be inserted from the opening of the reinforcing element and brought into contact with the signal layer exposed at the portion of the second surface to connect the signal layer to the housing.

According to another embodiment of the invention, an electronic device comprises a conductive housing, a substrate, a flexible substrate, a reinforcing element, and a conductor. The substrate is configured to be housed in the housing and mounted with an electronic component. The flexible substrate is configured to be formed of a conductive signal layer stacked on a flexible insulating base material and covered with an insulating cover layer. The flexible substrate comprises a first surface provided with a connector to connect to the substrate, and a second surface on a reverse side of the first surface, which has a portion where the signal layer is partially exposed at a position corresponding to where the connector is provided on the first surface. The reinforcing element is configured to be provided on the second surface to reinforce the flexible substrate and have an opening corresponding to the portion where the signal layer is partially exposed and where the connector is provided on the first surface. The conductor is configured to be inserted from the opening of the reinforcing element to be in contact with the signal layer exposed at the portion of the second surface to connect the signal layer to the housing. The conductor is configured to be in contact with the signal layer exposed at the portion of the second surface via a conductive ground material.

With reference to FIGS. 1 to 9, a description will be given of an electronic device according to an embodiment of the invention. The electronic device is described below as a portable notebook computer (hereinafter, "notebook PC").

Figure 1:
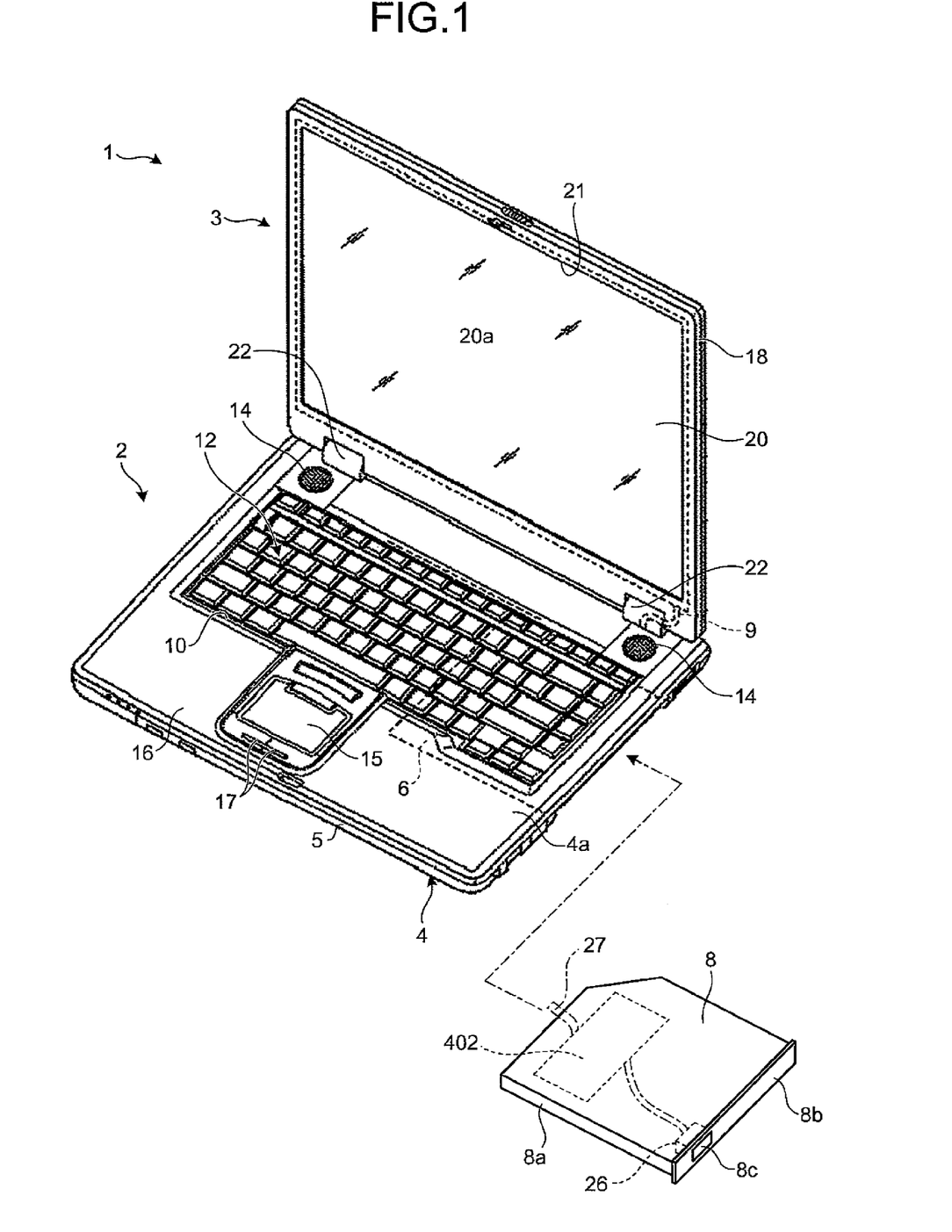
FIG. 1 is an exemplary perspective view of a notebook personal computer (PC) according to an embodiment of the invention.
Figure 2:
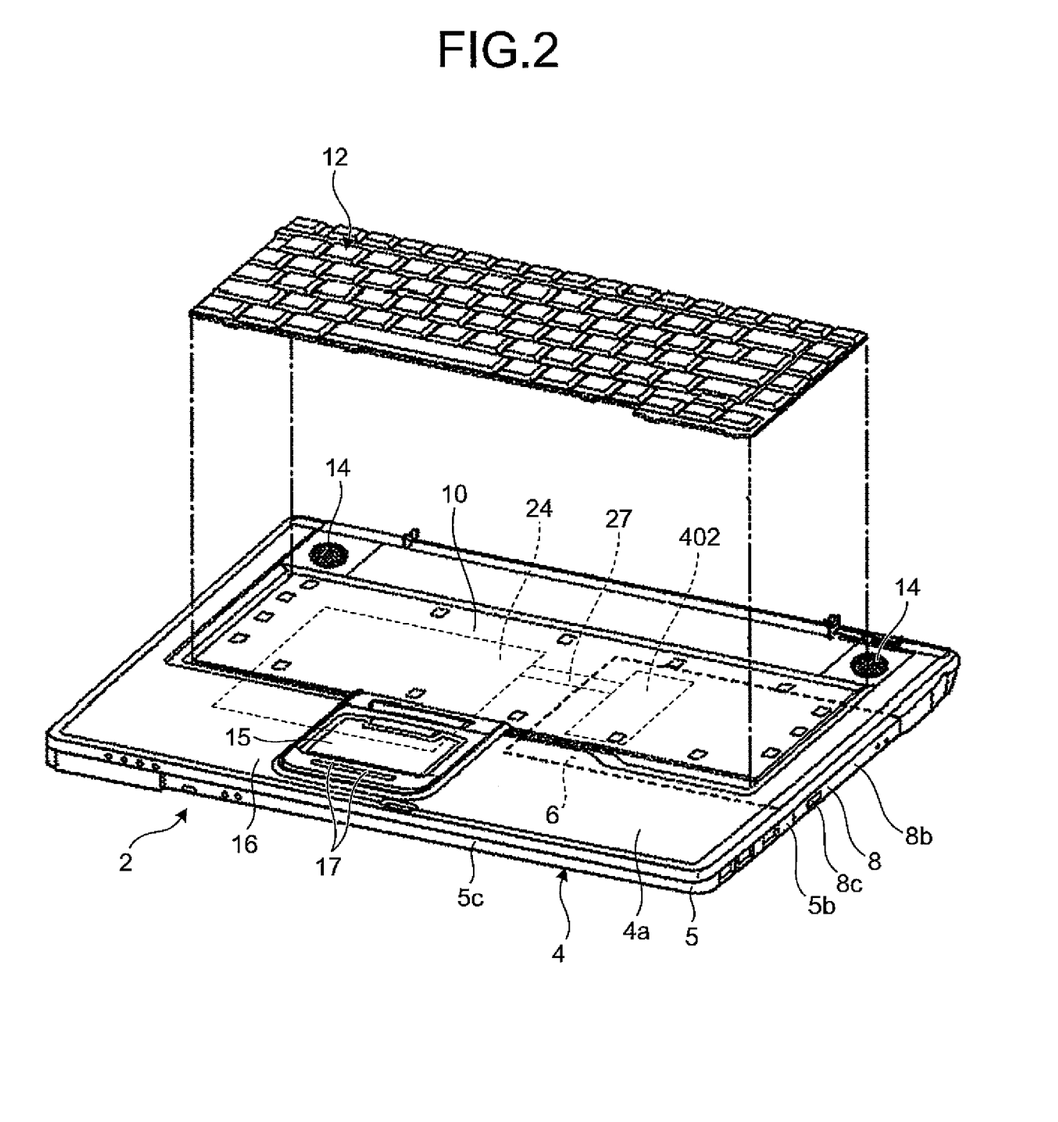
FIG. 2 is an exemplary exploded perspective view of where a keyboard is arranged on the notebook PC in the embodiment.
Figure 3:
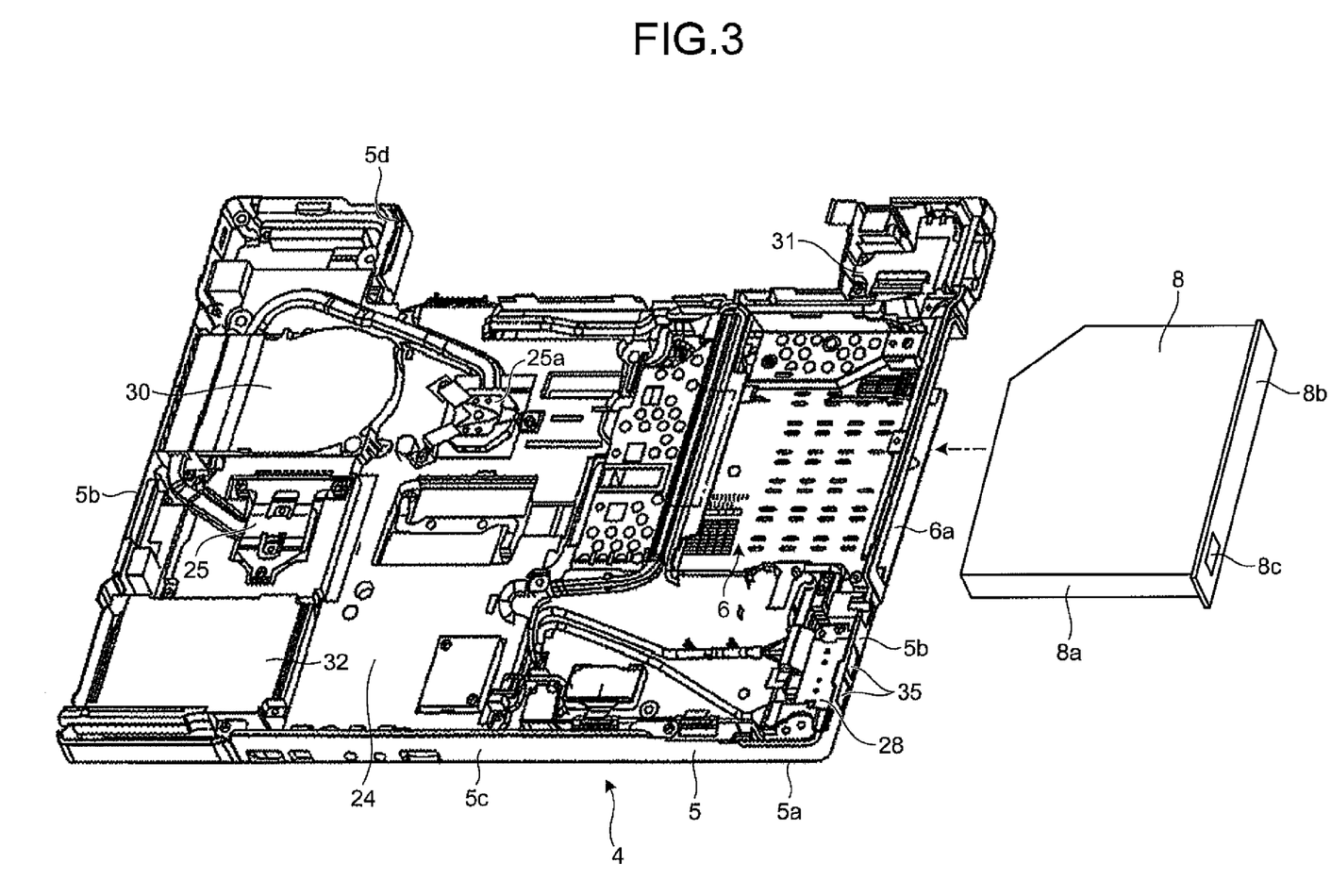
FIG. 3 is an exemplary perspective view of the internal structure of the notebook PC in the embodiment.

FIG. 1 is a perspective view of a notebook PC 1 according to the embodiment. FIG. 2 is an exploded perspective view of where a keyboard is arranged on the notebook PC 1. FIG. 3 is a perspective view of the internal structure of the notebook PC 1. As illustrated in FIG. 1, the notebook PC 1 comprises a main body 2 and a display module 3 that is supported by the main body 2. The main body 2 comprises a housing 4 made of, for example, synthetic resin. The housing 4 comprises a base 5 and a top cover 4a, and has a flat box-like shape. In the housing 4 is formed a compartment 6 that generally houses an optical disk drive (ODD).

As illustrated in FIGS. 1 and 2, the housing 4 is provided with a keyboard mounting area 10 in the center of the top cover 4a, and a keyboard 12 is mounted on the keyboard mounting area 10. Speakers 14 are arranged to be exposed on the rearward side of the top cover 4a, one each on the left and right sides. On the other hand, a palm rest 16 is formed on the front side of the top cover 4a. A touchpad 15 and a click button 17 are provided in substantially the center of the palm rest 16.

As illustrated in FIG. 1, the display module 3 comprises a flat box-like housing 18 and a liquid crystal display (LCD) panel 20 that is housed in the housing 18. The LCD panel 20 is provided with a display screen 20a. The display screen 20a is exposed to the outside through an opening 21 formed on the housing 18. The housing 18 comprises a pair of legs 22 extending from an edge thereof. The legs 22 are each rotatably supported via a hinge (not illustrated) on the rear edge of the housing 4. This allows the display module 3 to rotate between a closed position and an open position. The display module 3 lies and covers over the keyboard 12 in the closed position, while it stands on the rearward side of the keyboard 12 in the open position.

As illustrated in FIGS. 2 and 3, the base 5 of the housing 4 has a bottom wall 5a, left and right side walls 5b, a front wall 5c, and a rear wall 5d in an integrated manner. The bottom wall 5a faces the top cover 4a, and is of substantially rectangular shape. The left and right side walls 5b, the front wall 5c, and the rear wall 5d stand around the bottom wall 5a. A printed circuit board 24 is provided on the bottom wall 5a. On the printed circuit board 24 are mounted a plurality of semiconductor devices 25 including a CPU 25a, a USB board 28, and various types of electronic components.

The base 5 is provided with a cooling fan 30 for cooling the semiconductor devices 25 including the CPU 25a, a card slot 32 to which is inserted an electronic component card such as a PC card, and an RGB board 31. The RGB board 31 is connected via a cable 9 to the LCD panel 20 of the display module 3.

On the USB board 28 are provided a plurality of, for example, two USB connectors 35. The USB connectors 35 each correspond to an opening formed in the side wall 5b.

As described above, in the housing 4, specifically, in the base 5, the compartment 6 is formed in a flat box-like shape. The compartment 6 has an insertion opening 6a on the side wall 5b of the base 5 generally for placement of an ODD. An ODD once housed in the compartment 6 can be taken out from the insertion opening 6a.

In the notebook PC 1 of the embodiment, however, the compartment 6 houses a modem module 8 instead of an ODD, i.e., an ODD is not housed in the compartment 6. This is because, when the user carries the notebook PC 1 to the outside and use it, such an ODD is often not required and, if necessary, the use of an external ODD, which is connectable via USB, etc., may suffice.

The modem module 8 comprises a flat box-like modem body 8a and a front wall 8b that closes the insertion opening 6a on the side wall 5b of the base 5. As illustrated in FIG. 1, to the modem body 8a are provided a modem connection terminal 26 and a modem daughter card (MDC) 402 connected via a cable to the modem connection terminal 26. The MDC 402 is connected to the printed circuit board 24 having electronic components such as the CPU 25a mounted thereon. It is assumed herein that the MDC 402 is a semiconductor substrate mounted with a small semiconductor (electronic component) for adding an extra function to the notebook PC 1. In the front wall 8b of the modem module 8 is formed an opening 8c corresponding to the modem connection terminal 26.

In this manner, the modem module 8 is housed in the compartment 6 capable of housing an ODD. Thus, in the thin notebook PC 1 with a large battery capacity, where there is a limitation on the number of connection terminals that can be provided to the housing, a desired connection terminal, such as the modem connection terminal 26, can be additionally provided in the compartment 6 without housing an ODD.

Figure 4:
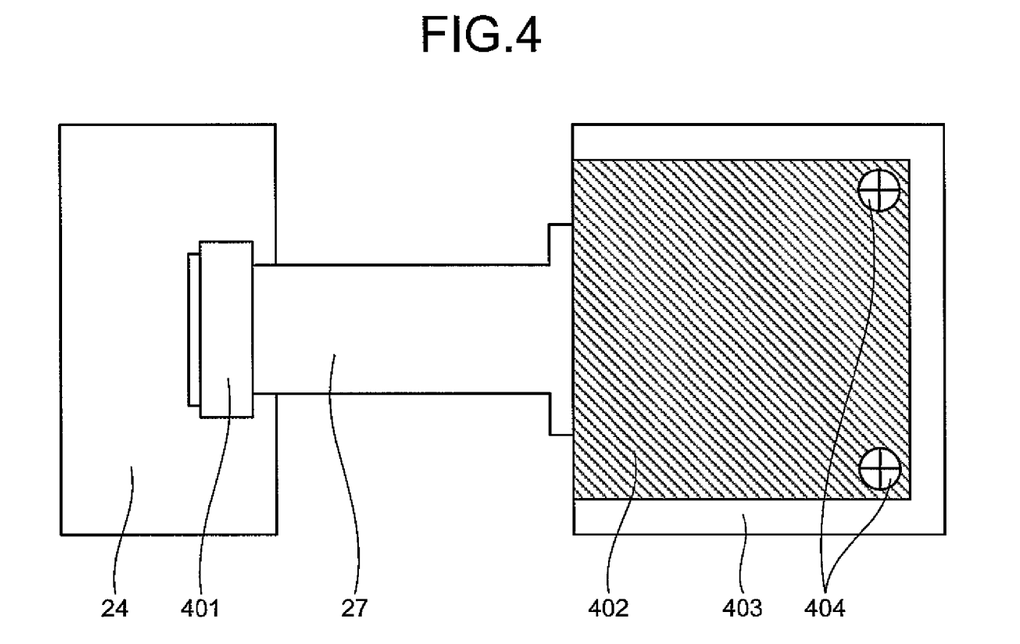
FIG. 4 is an exemplary overhead view of a printed circuit board and a modem daughter card (MDC) connected together with a flexible substrate in the embodiment.
Figure 5:
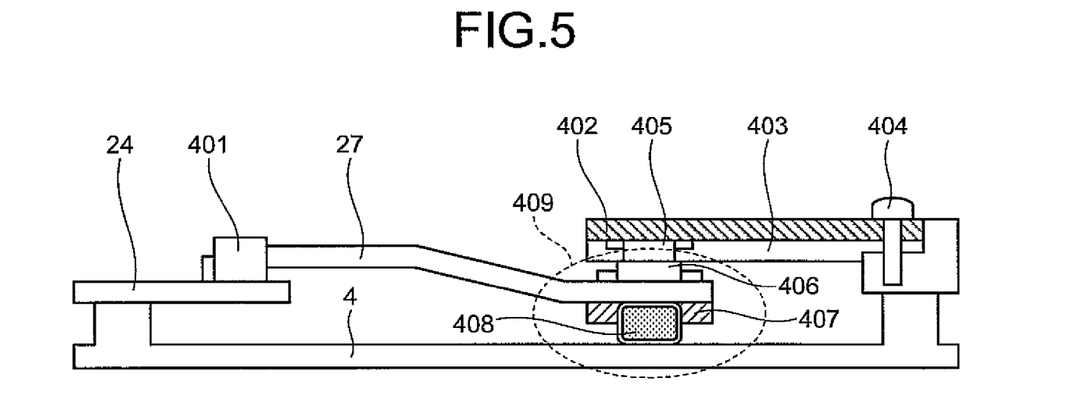
FIG. 5 is an exemplary cross-sectional view of the printed circuit board and the MDC connected together with the flexible substrate in the embodiment.
Figure 6:
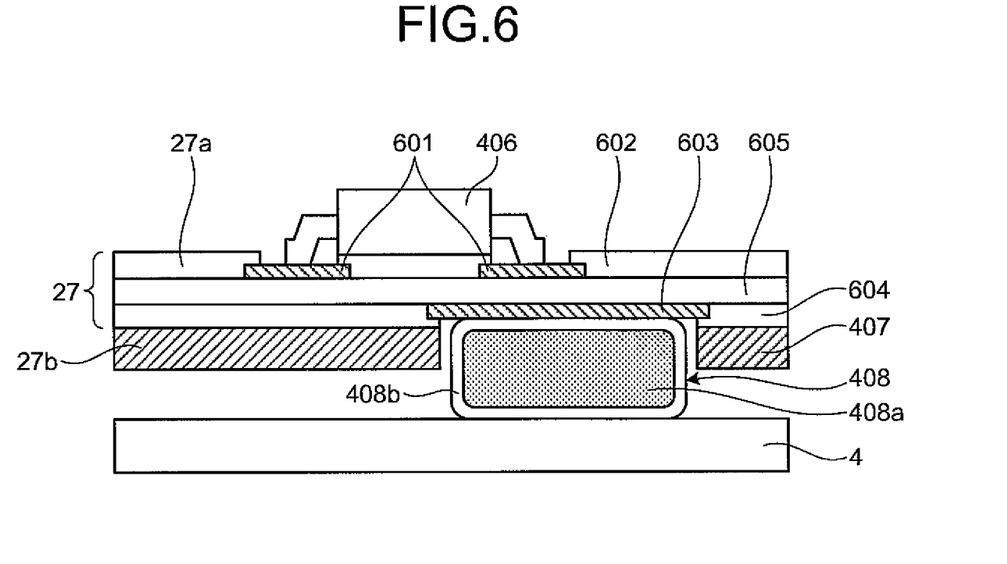
FIG. 6 is an exemplary cross-sectional view of a portion where the flexible substrate and a housing are connected together in the embodiment.

With reference to FIGS. 4 to 6, a description will then be given of how the printed circuit board 24 and the MDC 402 are mounted in the embodiment. FIG. 4 is an overhead view of the printed circuit board 24 and the MDC 402 connected together with a flexible substrate 27. FIG. 5 is a cross-sectional view of the printed circuit board 24 and the MDC 402 connected together with the flexible substrate 27. FIG. 6 is a cross-sectional view of a portion where the flexible substrate 27 and the housing 4 are connected together (a portion 409 indicated by a dotted circle in FIG. 5).

A conducting coating is applied to the housing 4 to make it conductive. The printed circuit board 24 is fixed to the housing 4. Although not illustrated in the drawings, it is assumed herein that the ground (GND) of the printed circuit board 24 and the housing 4 are electrically connected to each other. The printed circuit board 24 is connected via a connector 401 to the flexible substrate 27. The housing 4 may be made of metal such as magnesium.

A nonconductive module holder 403 is fixed to the housing 4. Further, the MDC 402 is fixed to the module holder 403 with a fixing screw 404. The MDC 402 is mounted on the flexible substrate 27 with a male connector 405 connected to a female connector 406 provided on the flexible substrate 27.

In the embodiment, the MDC 402 is cited as a module that is connected to the female connector 406 and mounted on the flexible substrate 27. However, this is by way of example and not by way of limitation, as other types of modules may be applied. That is, other types of modules having a connector connectable to the female connector 406 may be similarly mounted on the flexible substrate 27.

The flexible substrate 27 comprises a signal layer 605 and cover layers 602 and 604. The signal layer 605 is made of a conductive material stacked in layers on both sides of a flexible insulating base material. The cover layers 602 and 604 are insulators that cover the signal layer 605. Although the embodiment describes an example in which the signal layer 605 is stacked in layers on both sides of the base material, it is not so limited. For example, the signal layer 605 may be stacked on one side of the base material with a similar effect. Besides, the flexible substrate 27 has a first mounting surface 27a and a second mounting surface 27b opposite the first mounting surface 27a. The MDC 402 is mounted on the first mounting surface 27a. The signal layer 605 is partially exposed from the second mounting surface 27b. In the flexible substrate 27 of the embodiment, the signal layer 605 is also partially exposed from the first mounting surface 27a. Conductive pads 601 are provided on the exposed portions such that the female connector 406 is mounted on the flexible substrate 27 via the conductive pads 601.

Figure 7:
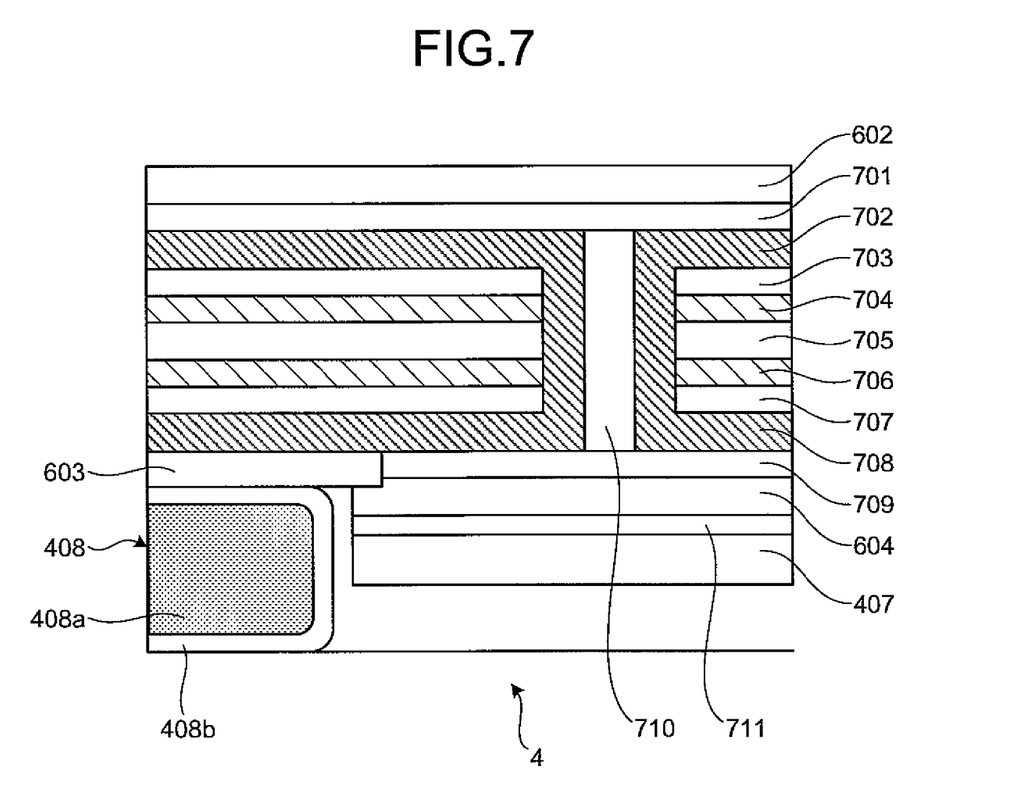
FIG. 7 is an exemplary cross-sectional view of the flexible substrate in the embodiment.

With reference to FIG. 7, a description will now be given of the detailed structure of the flexible substrate 27 and how to manufacture it. FIG. 7 is a cross-sectional view of the flexible substrate 27.

First, adhesives 704 and 706 are applied to the both sides of a flexible insulating base film 705, and silver foil sheets 703 and 707 are adhered thereto. Next, a through hole is formed to pass through from the surface of the silver foil sheet 703 to the silver foil sheet 707. Then, copper is evaporated on the silver foil sheets 703 and 707, and the through hole. Thus, the signal layer 605 is formed that comprises copper platings 702 and 708, and a copper plated hole 710 that connects the copper platings 702 and 708. Thereafter, adhesives 701 and 709 are applied to the copper platings 702 and 708, and the insulating cover layers 602 and 604 are adhered thereto to cover the copper platings 702 and 708, and the copper plated hole 710 of the signal layer 605.

The copper plating 708 of the signal layer 605 is partially exposed from the second mounting surface 27b of the flexible substrate 27. A conductive GND pad (ground material) 603 is provided on the portion where the copper plating 708 is exposed to prevent the copper plating 708 from peeling off. Although the GND pad 603 is described above as being provided on the portion where the copper plating 708 is exposed, this is by way of example only and is not intended to be limiting. For example, if the signal layer 605 is made of a conductive material that is unlikely to peel off, the GND pad 603 may not necessarily be provided.

To mount a surface-mountable electronic component such as the MDC 402 on the flexible substrate 27 manufactured as above, it is necessary to ensure the flatness and strength of the flexible substrate 27 upon mounting of the surface-mountable electronic component.

For this reason, in the embodiment, an adhesive 711 applied to the flexible substrate 27 except the portion where the copper plating 708 is exposed, and a reinforcing layer 407 is provided thereon to reinforce the flexible substrate 27. In general, the reinforcing layer 407 is made of a nonconductive material.

The reinforcing layer 407 has an opening corresponding to the portion of the second mounting surface 27b of the flexible substrate 27 where the copper plating 708 of the signal layer 605 is exposed and covered by the GND pad 603. With this, the portion where the copper plating 708 is exposed (the GND pad 603) is not covered by the reinforcing layer 407, and the GND pad 603 is kept to be exposed.

A gasket 408 is a conductor used to reduce radiated electromagnetic interference (EMI). The gasket 408 is inserted from the opening of the reinforcing layer 407. The gasket 408 is placed to be in contact with the portion where the copper plating 708 is exposed (the GND pad 603), thereby connecting the copper platings 702 and 708 to the housing 4. This provides conduction between the flexible substrate 27 and the housing 4. Although it is assumed herein that the gasket 408 is formed of a sponge 408a and a conductive material 408b that covers the sponge 408a, it is not so limited. For example, a conductive material such as a surface-mountable on-board connector may be used with the same effect.

As described above, according to the embodiment, the reinforcing layer 407 that reinforces the flexible substrate 27 has an opening, which provides a space by the thickness of the reinforcing layer 407 in the place where the gasket 408 is to be arranged. This space serves as an indication for the position of the gasket 408, and makes it clear where to position the gasket 408. Thus, the gasket 408 for reducing EMI can be effectively positioned with high accuracy.

Moreover, conduction can be obtained between the flexible substrate 27 and the housing 4 without an EMI countermeasure component used in conventional electronic devices such as a shielding material and a conductive tape wound around the flexible substrate. Accordingly, necessary electronic components can be reduced, resulting in less manufacturing steps. As a result, an effective and lower cost solution for EMI can be provided.

In the following, a modification of the embodiment will be described. In the embodiment described above, as illustrated in FIG. 6, the signal layer 605 is exposed from a portion slightly shifted from a position on the second mounting surface 27b corresponding to where the female connector 406 is mounted on the flexible substrate 27. However, the signal layer 605 may be exposed from a portion on the second mounting surface 27b corresponding to the position of the female connector 406, and the gasket 408 may be arranged in the exposed portion. With this, when the flexible substrate 27 is inclined, the female connector 406 can be prevented from disconnecting from the male connector 405 of the MDC 402.

Figure 8:
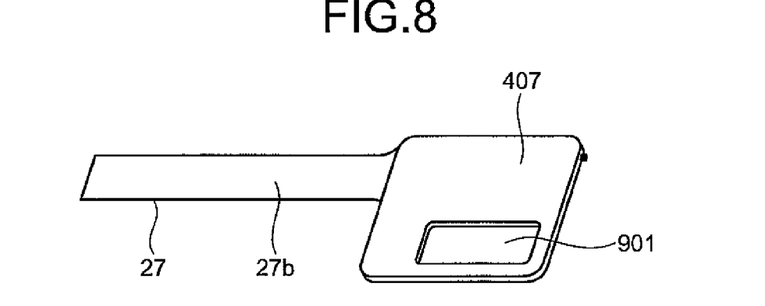
FIG. 8 is an exemplary perspective view of the flexible substrate attached with a reinforcing layer according to a modification of the embodiment.
Figure 9A:
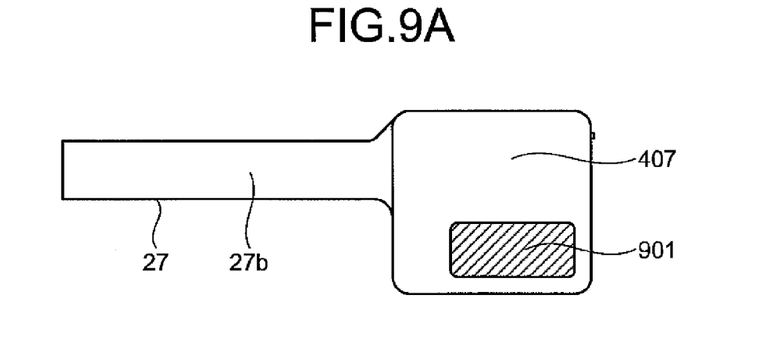
FIGS. 9A to 9C are exemplary schematic diagrams of the flexible substrate attached with the reinforcing layer in the modification.
Figure 9B:
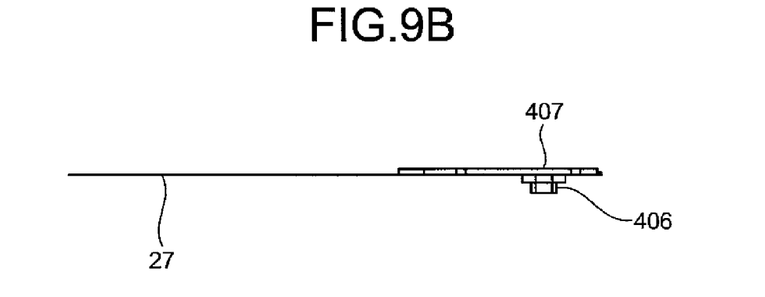
Figure 9C:
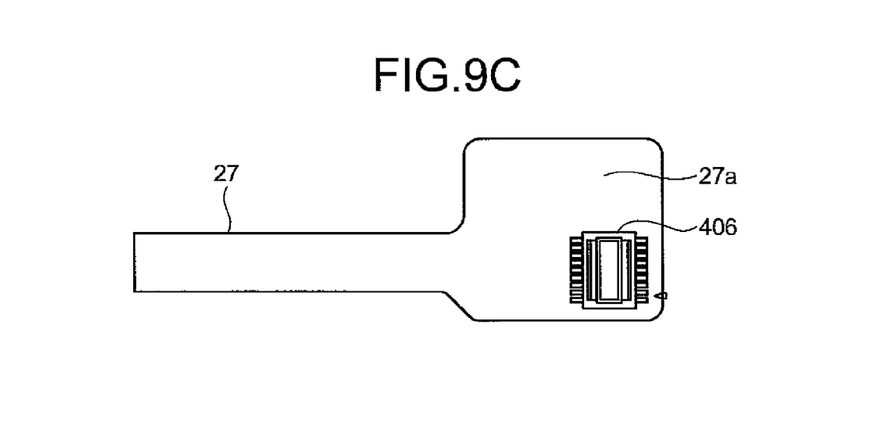

FIG. 8 is a perspective view of the flexible substrate 27 attached with the reinforcing layer 407 according the modification. FIG. 9A is a schematic diagram of the flexible substrate 27 having the reinforcing layer 407 attached to the second mounting surface 27b. FIG. 9B is a cross-sectional view of the flexible substrate 27 and the reinforcing layer 407. FIG. 9C is a schematic diagram of the flexible substrate 27 having the female connector 406 mounted on the first mounting surface 27a.

In this modification, as illustrated in FIGS. 8 and 9A to 9C, the signal layer 605 is exposed from a portion 901 on the second mounting surface 27b corresponding to the position of the female connector 406. Besides, the reinforcing layer 407 has an opening in the portion 901 where the signal layer 605 is exposed from the second mounting surface 27b.

In this manner, the gasket 408 is arranged on the direct back of the female connector 406 with the flexible substrate 27 between them. Therefore, not only conduction can be obtained between the flexible substrate 27 and the housing 4, but also the female connector 406 can be prevented from disconnecting from the male connector 405 due to, for example, an inclination of the flexible substrate 27 caused by an external force. If the gasket 408 is elastic, the female connector 406 can be more effectively prevented from disconnecting from the male connector 405.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a conductive housing;
   a substrate housed in the housing and mounted with an electronic component;

a flexible substrate formed of a conductive signal layer stacked on a flexible insulating base material and covered with an insulating cover layer, the flexible substrate comprising
- a first surface provided with a connector to connect to the substrate, and
- a second surface on a reverse side of the first surface, the second surface comprising a portion where the signal layer is partially exposed at a position corresponding to where a pad of the connector is provided on the first surface;

a reinforcing element on the second surface to reinforce the flexible substrate, the reinforcing element comprising an opening corresponding to the portion where the signal layer is partially exposed and where the pad of the connector is provided on the first surface; and a conductive gasket at the opening of the reinforcing element and in contact with the signal layer exposed at the portion of the second surface to connect the signal layer to the housing.

2. The electronic device of claim 1, wherein the conductive gasket comprises a sponge and a conductive material covering the sponge.

3. The electronic device of claim 1, wherein the conductive gasket comprises a surface-mountable on-board connector.

4. An electronic device comprising:
a conductive housing;
a substrate housed in the housing and mounted with an electronic component;
a flexible substrate formed of a conductive signal layer stacked on a flexible insulating base material and covered with an insulating cover layer, the flexible substrate comprising
- a first surface provided with a connector to connect to the substrate, and
- a second surface on a reverse side of the first surface, the second surface comprising a portion where the signal layer is partially exposed at a position corresponding to where the connector is provided on the first surface;

a reinforcing element on the second surface to reinforce the flexible substrate, the reinforcing element comprising an opening corresponding to the portion where the signal layer is partially exposed and where the connector is provided on the first surface; and a conductive gasket at the opening of the reinforcing element and in contact with the signal layer exposed at the portion of the second surface to connect the signal layer to the housing, wherein the conductive gasket is in contact with the signal layer exposed at the portion of the second surface via a conductive ground material.

5. The electronic device of claim 4, wherein the conductive gasket comprises a sponge and a conductive material covering the sponge.

6. The electronic device of claim 4, wherein the conductive gasket comprises a surface-mountable on-board connector.

* * * * *